(12) United States Patent
Kobayashi

(10) Patent No.: US 11,538,779 B2
(45) Date of Patent: Dec. 27, 2022

(54) SEMICONDUCTOR DEVICE WITH ELECTRODE PAD HAVING DIFFERENT BONDING SURFACE HEIGHTS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hitoshi Kobayashi, Yamato Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/190,121

(22) Filed: Mar. 2, 2021

(65) Prior Publication Data

US 2022/0093542 A1  Mar. 24, 2022

(30) Foreign Application Priority Data

Sep. 24, 2020 (JP) ............................. JP2020-159719

(51) Int. Cl.
 *H01L 23/00* (2006.01)
 *H01L 29/778* (2006.01)
(52) U.S. Cl.
 CPC .............. *H01L 24/05* (2013.01); *H01L 24/49* (2013.01); *H01L 29/7786* (2013.01);
 (Continued)

(58) Field of Classification Search
 CPC ..... H01L 24/05; H01L 24/49; H01L 29/7786; H01L 2224/04042; H01L 2224/05624;
 (Continued)

(56) References Cited

U.S. PATENT DOCUMENTS 5,633,525 A * 5/1997 Kitamura ............ H01L 23/4824
 257/E29.054
7,550,821 B2 * 6/2009 Shibata ................... H01L 24/05
 257/E29.091

(Continued)

FOREIGN PATENT DOCUMENTS

CN  112750898 A  * 5/2021

*Primary Examiner* — Mamadou L Diallo
(74) *Attorney, Agent, or Firm* — Kim & Stewart LLP

(57) ABSTRACT

A semiconductor device includes a first electrode on a semiconductor element at a first location and a second electrode on the semiconductor element at a second location spaced from the first location. And insulating film covers the first electrode, the second electrode and a third electrode. First and second pads are on the insulating film. The first electrode contacts the first pad through an opening in a first portion of the insulating film. The second electrode contacts the second pad each through an opening in a second portion of the insulating film. A bonding surface of the first pad is at a first distance above one portion of the insulating film, and a second distance above another. A bonding surface of the second pad likewise at different distances above the insulating film depending on location.

20 Claims, 4 Drawing Sheets

(52) U.S. Cl.
CPC ............... *H01L 2224/04042* (2013.01); *H01L 2224/05624* (2013.01); *H01L 2224/0603* (2013.01); *H01L 2224/49176* (2013.01)

(58) Field of Classification Search
CPC ... H01L 2224/0603; H01L 2224/49176; H01L 29/2003; H01L 29/402
See application file for complete search history.

(56) References Cited

U.S. PATENT DOCUMENTS

| | | | |
|---|---|---|---|
| 9,406,628 B2 | 8/2016 | Matsumoto et al. | |
| 10,468,488 B2 | 11/2019 | Iwatsu | |
| 2004/0130380 A1* | 7/2004 | Asano | H01L 21/8252 |
| | | | 257/E27.06 |
| 2010/0109015 A1* | 5/2010 | Ueno | H01L 29/0649 |
| | | | 257/E29.089 |
| 2012/0235210 A1* | 9/2012 | Takemae | H01L 29/402 |
| | | | 257/E21.403 |
| 2013/0299842 A1* | 11/2013 | Prechtl | H01L 29/7786 |
| | | | 257/194 |
| 2015/0060948 A1* | 3/2015 | Kawai | H01L 29/404 |
| | | | 257/194 |
| 2015/0187886 A1* | 7/2015 | Park | H01L 29/66462 |
| | | | 257/192 |
| 2015/0279781 A1* | 10/2015 | Kaibara | H01L 29/7787 |
| | | | 257/775 |
| 2017/0040444 A1* | 2/2017 | Lin | H01L 23/49537 |
| 2017/0077284 A1* | 3/2017 | Ono | H01L 29/402 |
| 2017/0148883 A1* | 5/2017 | Curatola | H01L 29/408 |
| 2018/0012826 A1* | 1/2018 | Saito | H01L 21/561 |
| 2018/0097070 A1* | 4/2018 | Miura | H01L 29/94 |
| 2018/0190877 A1* | 7/2018 | Hirano | H01L 21/78 |
| 2019/0296112 A1* | 9/2019 | Yoshimochi | H01L 29/41725 |
| 2020/0035560 A1* | 1/2020 | Block | H01L 27/0688 |
| 2022/0122903 A1* | 4/2022 | Yue | H01L 29/401 |

\* cited by examiner

SEMICONDUCTOR DEVICE WITH ELECTRODE PAD HAVING DIFFERENT BONDING SURFACE HEIGHTS

CROSS-REFERENCE TO RELATED APPLICATION(S)

This application is based upon and claims the benefit of priority from Japanese Patent Application No. 2020-159719, filed Sep. 24, 2020, the entire contents of which are incorporated herein by reference.

FIELD

Embodiments described herein relate generally to a semiconductor device.

BACKGROUND

A semiconductor element, such as a transistor or a diode, is used in circuits such as a switching power supply circuit or an inverter circuit. Such a semiconductor element is required to have a high breakdown voltage and a low on-state resistance.

An attempt has been made to reduce the on-state resistance ("RonS") ($m\Omega cm^2$) of a semiconductor element by providing a pad on the semiconductor element, and forming bonding wires on the pad for wiring. However, there is a fear that a high stress may be applied to the semiconductor element upon the formation of the pad and the bonding wires, causing damage to the semiconductor element.

DETAILED DESCRIPTION

Figure 1:
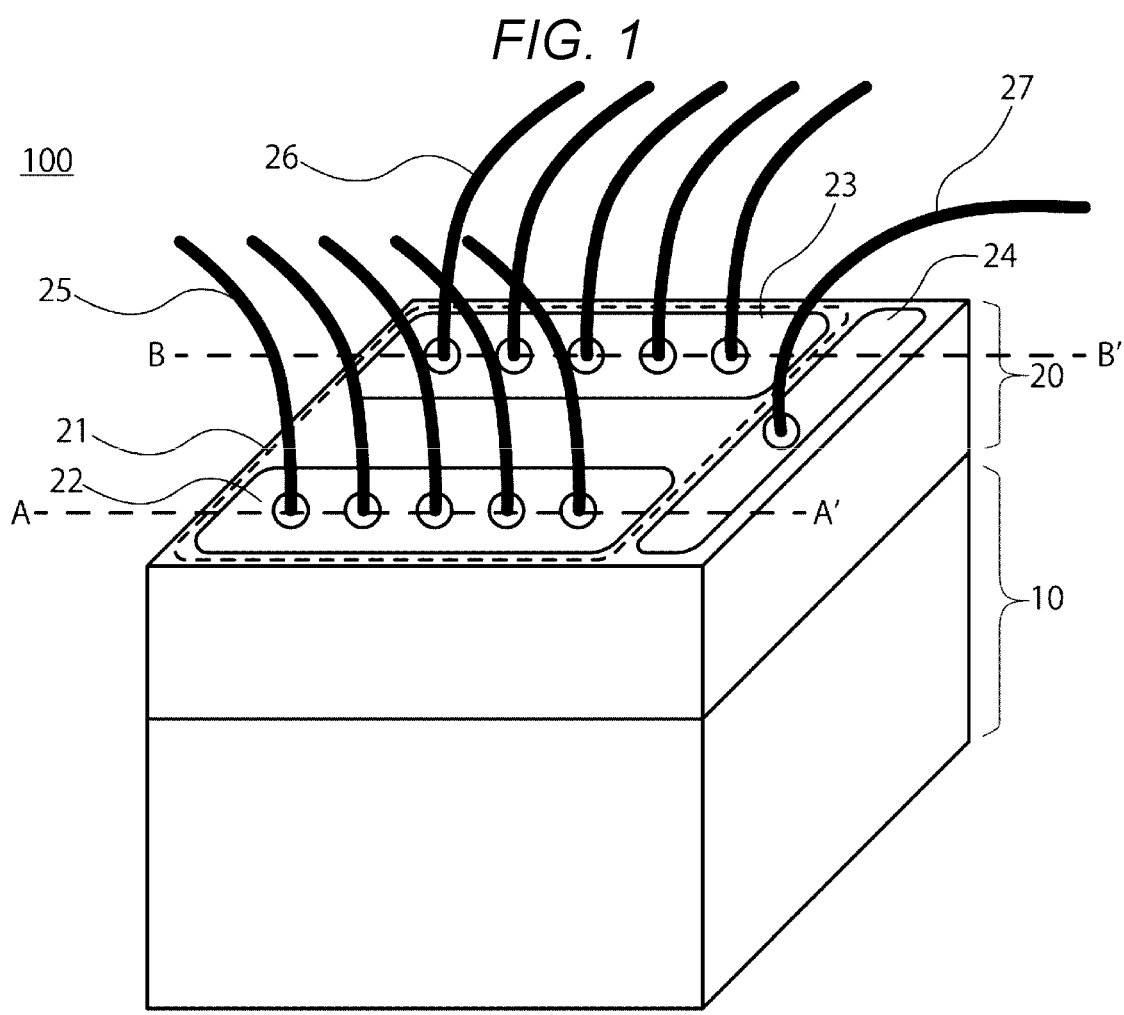
FIG. 1 is a perspective diagram of a semiconductor device according to a first embodiment.

Embodiments provide a highly-reliable semiconductor device.

In general, according to one embodiment, a semiconductor device includes a semiconductor element with a semiconductor layer. A first electrode is on the semiconductor element at a first location. A second electrode is on the semiconductor element at a second location that is spaced from the first location. A third electrode is on the semiconductor element at a third location between that is the first and second locations. An insulating film is on the semiconductor element and covers the first electrode, the second electrode and the third electrode. A first electrode pad on the insulating film, and a second electrode pad is on the insulating film spaced from the first electrode pad. The first electrode and the first electrode pad contact each other in a first opening in a first portion of the insulating film below the first electrode pad. The second electrode and the second electrode pad contact each other in a second opening in a second portion of the insulating film below the second electrode pad. A bonding surface of the first electrode pad is at a first distance from the semiconductor element for a portion of the first electrode pad on the first portion of the insulating film, and at a second distance from the semiconductor element for a portion of the first electrode pad on other than the first portion of the insulating film. The first and second distances are different from one another. A bonding surface of the second electrode pad is at a third distance from the semiconductor element for a portion of the second electrode pad on the second portion of the insulating film, and a fourth distance from the semiconductor element for a portion of the second electrode pad on other than the second portion of the insulating film. The third and fourth distances are different from one another.

Embodiments of the present disclosure will now be described with reference to the drawings. In the following description, the same symbols are used for the same or similar components or elements, and a duplicate description thereof is sometimes omitted.

As used herein, the term "nitride semiconductor layer" includes a "GaN semiconductor". Here, "GaN semiconductor" is a general term encompassing gallium nitride (GaN), aluminum nitride (AlN), indium nitride (InN), and a semiconductor material having an intermediate composition between these materials.

As used herein, the term "undoped" means that the impurity concentration is not more than $2\times10^{16}$ $cm^{-3}$.

An upward direction and a downward direction in the drawings are herein described in such terms as "above" and "below" to indicate a positional relationship between components relative to one another. The terms "above" and "below" and the like do not always refer to the corresponding positional concept in the gravitational direction.

First Embodiment

A semiconductor device according to a first embodiment includes a semiconductor element having a semiconductor layer, and a wiring layer on the semiconductor element. The following description illustrates a GaN semiconductor device; however, the semiconductor element may instead be a non-GaN lateral transistor.

Figure 2:
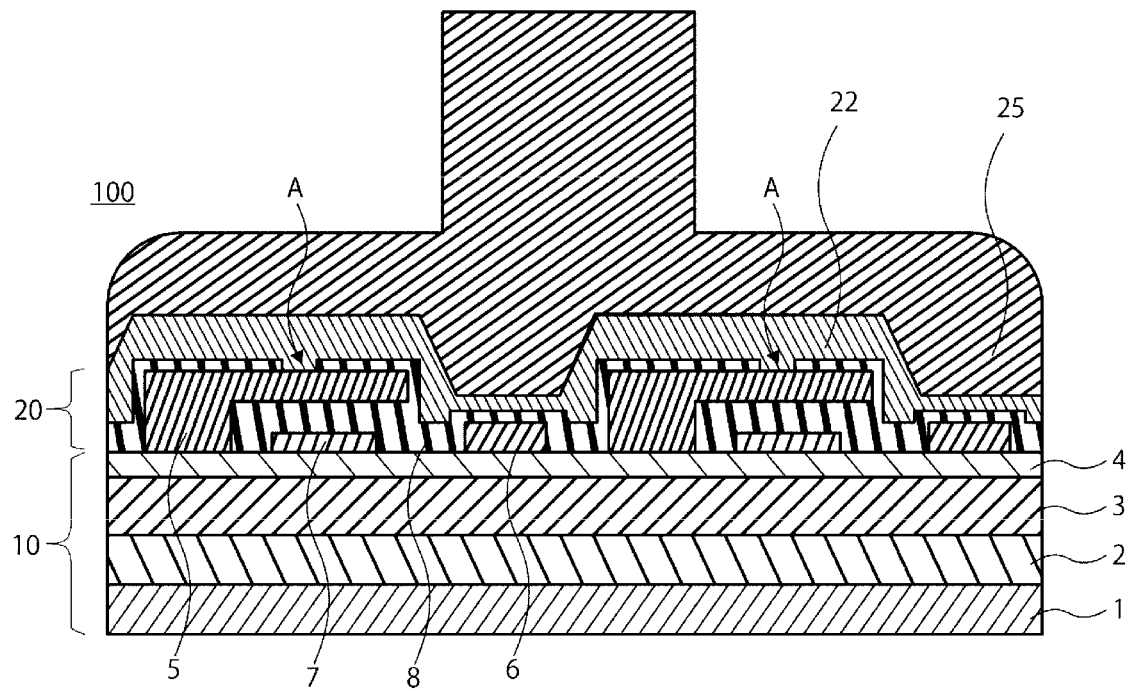
FIG. 2 is a schematic cross-sectional view of a semiconductor device according to a first embodiment.
Figure 3:
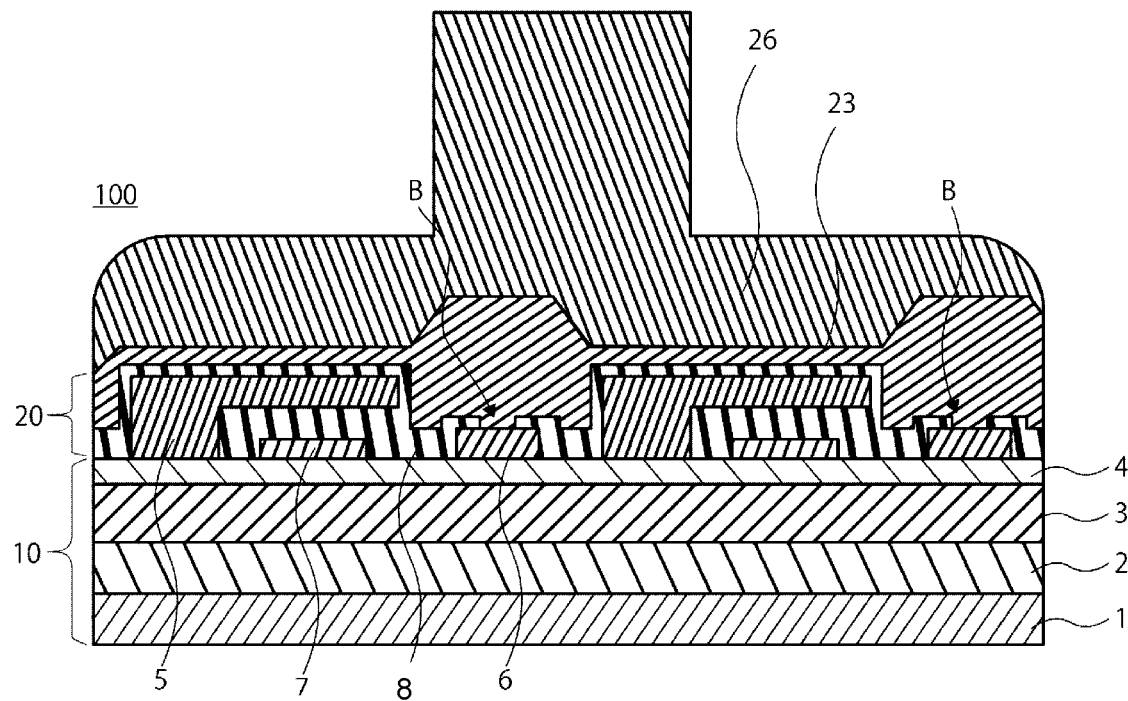
FIG. 3 is a schematic cross-sectional view of a semiconductor device according to a first embodiment.

FIG. 1 is a perspective conceptual diagram of a semiconductor device 100 according to the first embodiment. FIGS. 2 and 3 are schematic cross-sectional views of the semiconductor device 100 according to the first embodiment. FIG. 2 is a partial cross-sectional view of the A-A' cross-section of FIG. 1. FIG. 3 is a partial cross-sectional view of the B-B' cross-section of FIG. 1. The semiconductor element 10 is, for example, a HEMT (High Electron Mobility Transistor) using a GaN semiconductor. The semiconductor element 10 has an element area that operates as a transistor, and a non-element area that does not operate as a transistor. The element area of the semiconductor element 10 corresponds to the area surrounded by the dotted line 21 in FIG. 1. A first pad electrode 22 and a second pad electrode 23 of a wiring layer are located on the element area of the semiconductor element 10. A third pad electrode 24 of the wiring layer is located on the non-element area of the semiconductor element 10. FIG. 2 shows wiring for a first electrode 5, while FIG. 3 shows wiring for a second electrode 6.

The semiconductor element 10 includes a substrate 1, a buffer layer 2, a channel layer 3, and a barrier layer 4.

The substrate 1 is, for example, formed of silicon (Si). Besides silicon, it is possible to use, for example, sapphire ($Al_2O_3$) or silicon carbide (SiC).

The buffer layer 2 is provided on the substrate 1. The buffer layer 2 functions to reduce lattice mismatch between the substrate 1 and the channel layer 3. The buffer layer 2 has, for example, a multi-layer structure of aluminum gallium nitride ($Al_WGa_{1-W}N$ ($0<W\leq1$)).

The channel layer 3 is provided on the buffer layer 2. The channel layer 3 is also called an electron transit layer. The channel layer 3 is a nitride semiconductor layer formed of, for example, undoped aluminum gallium nitride ($Al_XGa_{1-X}N$ ($0\leq X<1$)). In particular, the channel layer 3 is, for example, formed of undoped gallium nitride (GaN). The thickness of the channel layer 3 is, for example, not less than 0.1 μm and not more than 10 μm. In this embodiment, the thickness of a layer or a member, including the channel layer 3, refers to the length (height) along the direction in which the channel layer 3 and the barrier layer 4 are stacked, which in the figures corresponds to the upward page direction.

The barrier layer 4 is provided on the channel layer 3. The barrier layer 4 is also called an electron donating layer in some instances. The band gap of the barrier layer 4 is larger than that of the channel layer 3. The barrier layer 4 is a nitride semiconductor layer formed of, for example, undoped aluminum gallium nitride ($Al_YGa_{1-Y}N$ ($0<Y\leq1$, $X<Y$)). In particular, the barrier layer 4 is, for example, formed of undoped $Al_{0.25}Ga_{0.75}N$. The thickness of the barrier layer 4 is, for example, not less than 2 nm and not more than 100 nm.

A heterojunction interface is formed between the channel layer 3 and the barrier layer 4. A two-dimensional electron gas (2DEG) is formed at the heterojunction interface, and serves as a carrier in the HEMT 100.

A wiring layer 20 is provided on the semiconductor element 10 of the semiconductor device 100. The wiring layer 20 has a first electrode 5, a second electrode 6, a third electrode 7, an insulating film 8, the first electrode pad 22, the second electrode pad 23, the third electrode pad 24, first bonding wires 25, second bonding wires 26, and a third bonding wire 27. The first bonding wires 25, the second bonding wires 26, and the third bonding wire 27 are connected to electrode terminals of the semiconductor device 100.

The first electrode 5 is, for example, a source electrode. The source electrode 5 is provided on the channel layer 3 and the barrier layer 4. The source electrode 5 is electrically connected to the channel layer 3 and the barrier layer 4. The source electrode 5 is, for example, in direct contact with the barrier layer 4.

The source electrode 5 is, for example, a metal electrode. The source electrode 5 is, for example, a film composed mainly of aluminum, (in this context, "mainly of aluminum" refers to material that is at least 50 wt % aluminum), such as an aluminum film or a stacked film consisting of a titanium (Ti) layer and an aluminum (Al) layer. The source electrode 5 is preferably in ohmic contact with the barrier layer 4.

The source electrode 5 includes a field plate electrode. A field plate electrode may also be connected to the source electrode 5. A plurality of field plate electrodes may be connected to the source electrode 5. In this case, the cross-sectional view of FIG. 2 depicts a source electrode 5 which includes a portion that extends to a position nearer to the drain electrode 6.

The second electrode 6 is a drain electrode. The drain electrode 6 is provided on the channel layer 3 and the barrier layer 4. The drain electrode 6 is electrically connected to the channel layer 3 and the barrier layer 4. The drain electrode 6 is, for example, in contact with the barrier layer 4.

The drain electrode 6 is, for example, a metal electrode. The drain electrode 6 is, for example, a film composed mainly of aluminum, such as an aluminum film or a stacked film consisting of a titanium (Ti) layer and an aluminum (Al) layer. The drain electrode 6 is preferably in ohmic contact with the barrier layer 4.

The distance between the source electrode 5 and the drain electrode 6 is, for example, not less than 5 μm and not more than 30 μm.

It is possible to employ a structure in which the source electrode 5 and the drain electrode 6 are in direct contact with the channel layer 3.

The third electrode 7 is a gate electrode. The gate electrode 7 is provided on the channel layer 3 and the barrier layer 4. The gate electrode 7 is electrically connected to the channel layer 3 and the barrier layer 4. The gate electrode 7 is, for example, in direct contact with the barrier layer 4. The gate electrode 7 is provided between the source electrode 5 and the drain electrode 6.

The gate electrode 7 is, for example, formed of titanium nitride (TiN).

It is also possible to incorporate a gate insulating film between the gate electrode 7 and the barrier layer 4 so as to construct the semiconductor device 100 as a MIS (Metal Insulator Semiconductor)-type HEMT. The gate insulating film can be, for example, formed of an oxide or an oxynitride. In particular, the gate insulating film can be, for example, formed of silicon oxide, aluminum oxide, silicon oxynitride, or aluminum oxynitride.

The gate electrode 7 includes a field plate electrode. A field plate electrode may also be connected to the gate electrode 7.

The insulating film 8 covers the source electrode 5, the drain electrode 6 and the gate electrode 7. The insulating film 8 is, for example, formed of an oxide or a nitride. The insulating film 8 is, for example, formed of silicon oxide ($SiO_2$), silicon nitride (SiN), or a high-dielectric constant (high-k) material. Hafnium oxide ($HfO_2$) is one example of a high-k material.

The type and the concentration of an element in a semiconductor layer or a semiconductor region can be measured by, for example, SIMS (Secondary Ion Mass Spectrometry) or EDX (Energy Dispersive X-ray Spectroscopy). The relative level of the concentration of an element can be estimated from the level of the concentration of a carrier as determined by, for example, SCM (Scanning Capacitance Microscopy). Distances such as the depth, the thickness and the width of an impurity region, and the interval between impurity regions can be determined by, for example, SIMS. Distances such as the depth, the thickness and the width of an impurity region, and the interval between impurity regions can also be determined by comparison of an SCM image with an atom probe image.

The first electrode pad 22 and the second electrode pad 23 of the wiring layer 20 are located adjacent to each other on the element area of the semiconductor element 10. The first electrode pad 22 is a source electrode pad. The second electrode pad 23 is a drain electrode pad. The third electrode pad 24 is a gate electrode pad.

The source electrode pad 22 is, for example, a metal electrode. The source electrode pad 22 is, for example, a film composed mainly of aluminum, such as an aluminum film or a stacked film consisting of a titanium (Ti) layer and an aluminum (Al) layer. The source electrode pad 22 has a first surface on the side opposite to the side facing the semiconductor element 10. The source electrode pad 22 is preferably in ohmic contact with the source electrode 5. The source electrode pad 22 is connected to the first bonding wires 25.

Typically, one bonding wire connects three unit cells each including a source region and a drain region. The accuracy of positioning of the first bonding wires 25 can be enhanced by providing recesses in the source electrode pad 22 at positions where the first bonding wires 25 are to be provided. The recesses can be formed, for example, by thickening the source electrode pad 22 in parts and/or the insulating film 8 in other areas besides those portions at the positions where the first bonding wires 25 are to be provided. Thus, the portions of the source electrode pad 22, to which the first bonding wires 25 are to be connected, become recessed with respect to the area of the source electrode pad 22 to which the first bonding wires 25 are not to be connected.

The drain electrode pad 23 is, for example, a metal electrode. The drain electrode pad 23 is, for example, a film composed mainly of aluminum, such as an aluminum film or a stacked film consisting of a titanium (Ti) layer and an aluminum (Al) layer. The drain electrode pad 23 has a first surface on the side opposite to the side facing the semiconductor element 10. The drain electrode pad 23 is preferably in ohmic contact with the drain electrode 6. The drain electrode pad 23 is connected to the second bonding wires 26. Typically, one bonding wire connects three unit cells each including a source region and a drain region. The accuracy of positioning of the second bonding wires 26 can be enhanced by providing recesses in the drain electrode pad 23 at positions where the second bonding wires 26 are to be provided. The recesses can be formed, for example, by thickening the drain electrode pad 23 in parts and/or the insulating film 8 in areas other than those at the positions where the second bonding wires 26 are to be provided. Thus, the portions of the drain electrode pad 23, to which the second bonding wires 26 are to be connected, become recessed with respect to the area of the drain electrode pad 23 to which the second bonding wires 26 are not to be connected.

The gate electrode pad 24 is, for example, a metal electrode. The gate electrode pad 24 is, for example, a film composed mainly of aluminum, such as an aluminum film or a stacked film consisting of a titanium (Ti) layer and an aluminum (Al) layer. The gate electrode pad 24 has a first surface on the side opposite to the side facing the semiconductor element 10. The gate electrode pad 24 is preferably in ohmic contact with the gate electrode 7. The gate electrode pad 24 is connected to the third bonding wire 27.

Wiring connections around the source electrode pad 22 will now be described with reference to the schematic cross-sectional views of FIGS. 2 and 3. The source electrode 5, the drain electrode 6, and the gate electrode 7 are located between the semiconductor element 10 and the insulating film 8. That is, the insulating film 8 covers these components or these components are embedded in the insulating film 8. The insulating film 8 includes a portion that is located between the source electrode pad 22 and the source electrode 5. Another portion of the insulating film 8 is located between the source electrode pad 22 and the drain electrode 6. The insulating film 8 shown in FIGS. 2 and 3 may be a continuous film and/or may be comprised of multiple insulating films of the same or different insulating material.

A first opening A is provided in a portion of the insulating film 8 which is located between the source electrode 5 and the source electrode pad 22. The source electrode 5 is in contact with, and thus is electrically connected to the source electrode pad 22 in the first opening A.

No opening is formed in the portion of the insulating film 8 which is located between the drain electrode 6 and the source electrode pad 22. Thus, the drain electrode 6 and the source electrode pad 22 are insulated from each other by the insulating film 8.

The source electrode pad 22 in this example has both raised and recessed portions. Here, a raised portion corresponds to a portion at which the source electrode pad 22 is in contact with and electrically connected to the source electrode 5 in the first opening A, while the recessed portion corresponds to a portion at which the source electrode pad 22 is insulated from the drain electrode 6 by the insulating film 8. Thus, the portion in electrical connection is raised in height, while the portion not in electrical connection is recessed.

The distance from the first surface of the source electrode pad 22 for the portion of the source electrode pad 22 at which the connection to the source electrode 5 is made to a semiconductor layer (e.g., the channel layer 3) of the semiconductor element 10 is larger than the distance from the first surface of the source electrode pad 22 for the portion of the source electrode pad 22 which is insulated from the drain electrode 6 to the same semiconductor layer (e.g., the channel layer 3).

The raised/recessed surface configuration of the source electrode pad 22 prevents a short circuit between the drain electrode 6 and the source electrode pad 22. When connecting the first bonding wires 25 to the source electrode pad 22, mechanical stress is applied to junctions points of the first bonding wires 25 to the source electrode pad 22, which can cause breakage of the underlying insulating film 8. A short circuit can be avoided by allowing the insulating film 8 to be preferentially broken at a location between the source electrode 5 and the source electrode pad 22 which are electrically connected to each other and intended as such. If the first surface of the source electrode pad 22 is flat, the stress is likely to be applied to the entire insulating film 8, which may result in breakage of any portion of the insulating film 8. However, when there is a raised portion in the source electrode pad 22, the stress concentrates at the raised portion. In this present embodiment, the source electrode pad 22 is recessed at the portion for which a short circuit should be avoided, but is raised at the portion for which no electrical problem would result even if the underlying insulating film 8 is broken and results in a connection between the conductive materials which otherwise would have been insulated by the insulating film 8 had the portion not broken. This can prevent a short circuit between the drain electrode 6 and the source electrode pad 22.

If the level difference (height difference) between the raised and recessed portions is too small, there may still be a fear of breakage of the insulating film 8 in the portion which lies on the drain electrode 6. However, if the level difference between the raised and recessed portions is too large, poor contact is more likely to occur between the bonding wires and the source electrode pad 22. The difference between the distance from the first surface of the source electrode pad 22 for the portion at which the source electrode pad 22 is connected to the source electrode 5 to the channel layer 3 and the distance from the first surface of the source electrode pad 22 for the portion at which the source electrode pad 22 is insulated from the drain electrode 6 to the channel layer 3 is preferably not less than 1 μm and not more than 10 μm.

The stress reduction effect is generally low when the width of the recessed portion is small. Therefore, the width of the recessed portion is preferably relatively large, for example, at least twice the width of the drain electrode 6.

In relation to the widths of the electrodes, the width of the recessed portion of the source electrode pad 22 is smaller than the width of the raised portion.

The insulating film 8 may be partly broken to form a crack (first crack) between the source electrode 5 and the source electrode pad 22. Such a crack is likely to be formed in the insulating film 8 when it is sandwiched between the source electrode 5 and the source electrode pad 22, which are both composed mainly of aluminum in this example. The source electrode 5 and the source electrode pad 22 can thus be electrically connected to each other also at the crack formed in the insulating film 8.

A second opening B is provided in the portion of the insulating film 8 which is located between the drain electrode 6 and the drain electrode pad 23. The drain electrode 6 is in contact with, and thus is electrically connected to the drain electrode pad 23 in the second opening B.

No opening is formed in the portion of the insulating film 8 which is located between the source electrode 5 and the drain electrode pad 23. Thus, the source electrode 5 and the drain electrode pad 23 are insulated from each other by the insulating film 8.

The drain electrode pad 23 has raised and recessed portions. Here, the raised portion corresponds to the portion at which the drain electrode pad 23 is in contact with and electrically connected to the drain electrode 6 in the second opening B, while the recessed portion corresponds to the portion at which the drain electrode pad 23 is insulated from the source electrode 5 by the insulating film 8. Thus, the portion in electrical connection is a raised portion, while the portion not in electrical connection is a recessed portion.

The distance from the first surface of the drain electrode pad 23 for the portion at which the drain electrode pad 23 is connected to the drain electrode 6 to a semiconductor layer (e.g., the channel layer 3) of the semiconductor element 10 is larger than the distance from the first surface of the drain electrode pad 23 for the portion at which the drain electrode pad 23 is insulated from the source electrode 5 to the semiconductor layer.

The raised/recessed surface configuration of the drain electrode pad 23 prevents a short circuit between the source electrode 5 and the drain electrode pad 23. When connecting the second bonding wires 26 to the drain electrode pad 23, mechanical stress is applied to junction points of the second bonding wires 26 and the drain electrode pad 23, which can cause breakage of the insulating film 8. A short circuit can be prevented by allowing the insulating film 8 to be preferentially broken at a location between the drain electrode 6 and the drain electrode pad 23 which are electrically connected to each other and intended as such. If the first surface of the drain electrode pad 23 is flat, the stress is likely to be applied to the entire insulating film 8, which may cause breakage of any portion of the insulating film 8. When there is a raised portion in the drain electrode pad 23, the stress concentrates at the raised portion. In this present embodiment, the drain electrode pad 23 is recessed at the portion for which a short circuit should be avoided, but is raised at the portion for which no electrical problem would result even if the insulating film 8 is broken and results in a connection between the conductive materials which otherwise would have been insulated by the insulating film 8 had the portion not broken. This can prevent a short circuit between the source electrode 5 and the drain electrode pad 23.

If the level difference (height difference) between the raised and recessed portions is too small, there may still be a fear of breakage of the insulating film 8 in the portion which lies on the source electrode 5. However, if the level difference between the raised and recessed portions is too large, poor contact is more likely to occur between the bonding wires and the drain electrode pad 23. The difference between the distance from the first surface of the drain electrode pad 23 for the portion at which the drain electrode pad 23 is connected to the drain electrode 6 to the channel layer 3 and the distance from the first surface of the drain electrode pad 23 for the portion at which the drain electrode pad 23 is insulated from the source electrode 5 to the channel layer 3 is preferably not less than 1 μm and not more than 10 μm.

The stress reduction effect is generally low when the width of the recessed portion is small. Therefore, the width of the recessed portion is preferably large, for example, at least 1.2 times the width of the source electrode 5.

In relation to the widths of the electrodes, the width of the recessed portion of the drain electrode pad 23 is larger than the width of the raised portion.

The insulating film 8 may be partly broken to form a crack (second crack) between the drain electrode 6 and the drain electrode pad 23. Such a crack is more likely to be formed in the insulating film 8 when it is sandwiched between the drain electrode 6 and the drain electrode pad 23, which are both composed mainly of aluminum in this example. The drain electrode 6 and the drain electrode pad 23 are can thus be electrically connected to each other also at the crack formed in this insulating film 8.

Second Embodiment

Figure 4:
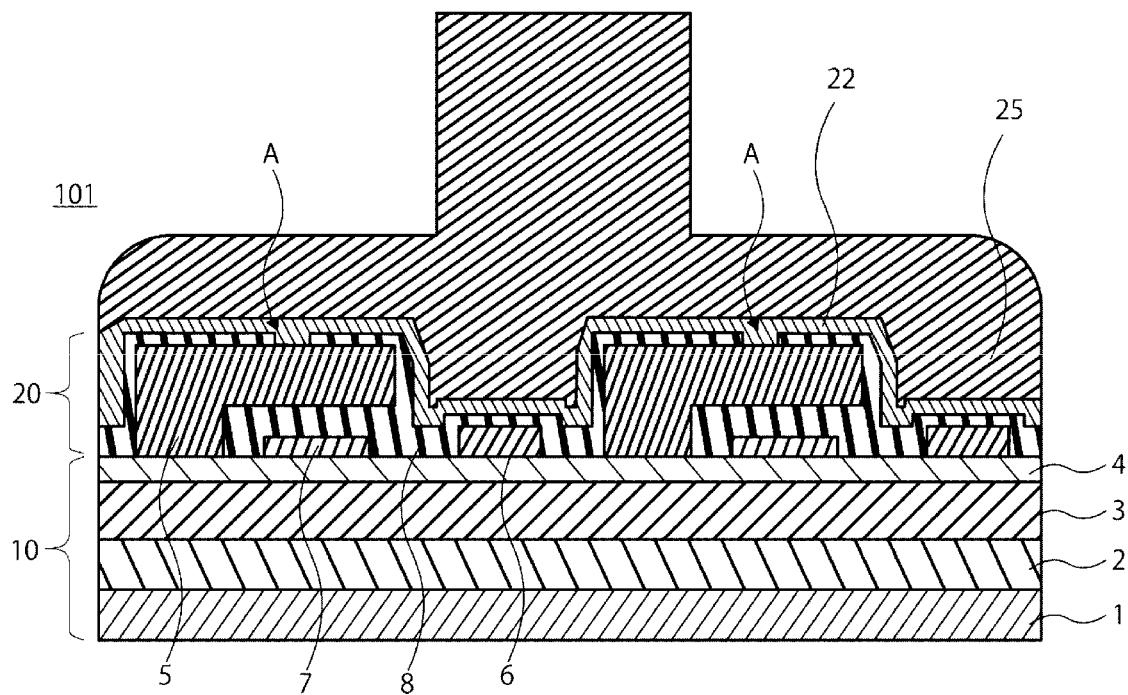
FIG. 4 is a schematic cross-sectional view of a semiconductor device according to a second embodiment.
Figure 5:
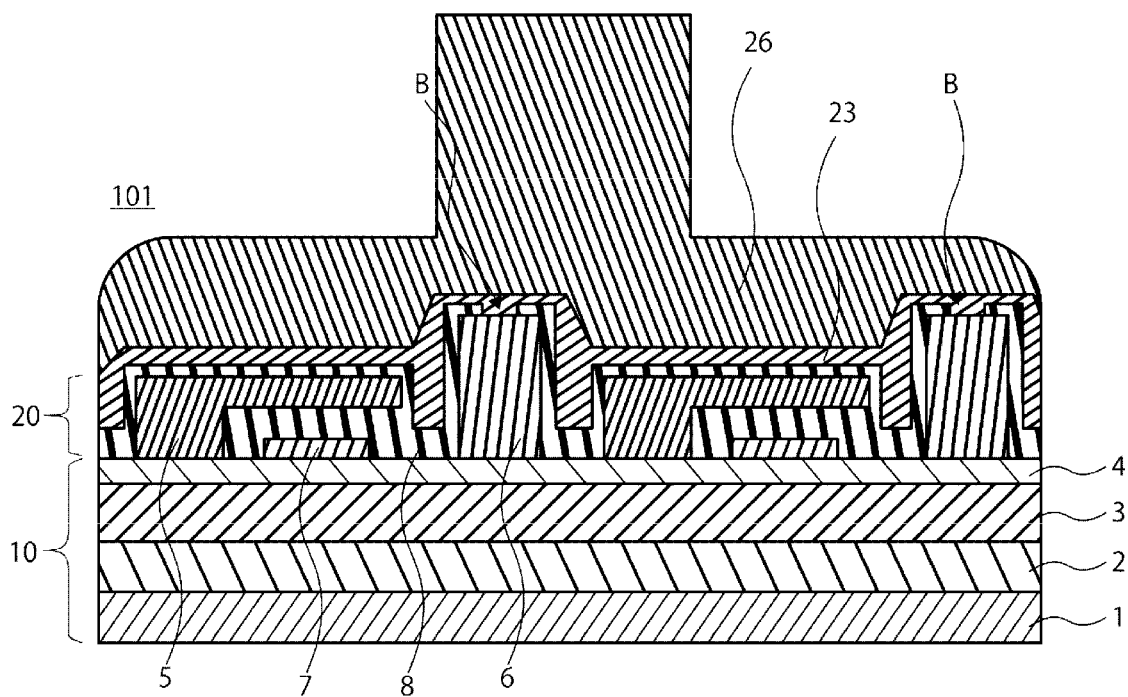
FIG. 5 is a schematic cross-sectional view of a semiconductor device according to a second embodiment.

FIGS. 4 and 5 show schematic cross-sectional views of a semiconductor device 101 according to the second embodiment. FIG. 4 is a partial cross-sectional view of the semiconductor device 101 of the second embodiment in a cross-section corresponding to the A-A' cross-section of FIG. 1. FIG. 5 is a partial cross-sectional view of the semiconductor device 101 of the second embodiment in a cross-section corresponding to the B-B' cross-section of FIG. 1. The semiconductor device 101 of the second embodiment has the similar structure as the semiconductor device 100 of the first embodiment except that in the semiconductor device 101, the source electrode 5 is made thicker in the portion lying under the source electrode pad 22, and the drain electrode 6 is made thicker in the portion lying under the drain electrode pad 23.

As with the first embodiment, the second embodiment can provide a highly-reliable semiconductor device 101.

In the present embodiments, the particularly changed or added features or aspects described for one embodiment may be adopted or adapted for any of the other described embodiments in part or in whole, as applicable. With regard to features common to present embodiments, redundant description may be omitted from subsequently described embodiments.

In the second embodiment, raised and recessed portions are formed in the surface of the source electrode pad 22 and in the surface of the drain electrode pad 23 by changing the thicknesses of the respective electrodes. In some examples, a stack of different metals (e.g., alternating layers) may be used for the thick portion of each electrode.

It is possible to prevent a source-drain short circuit and provide a highly-reliable semiconductor device 101 also by thus changing the thicknesses of the electrodes as depicted.

Third Embodiment

Figure 6:
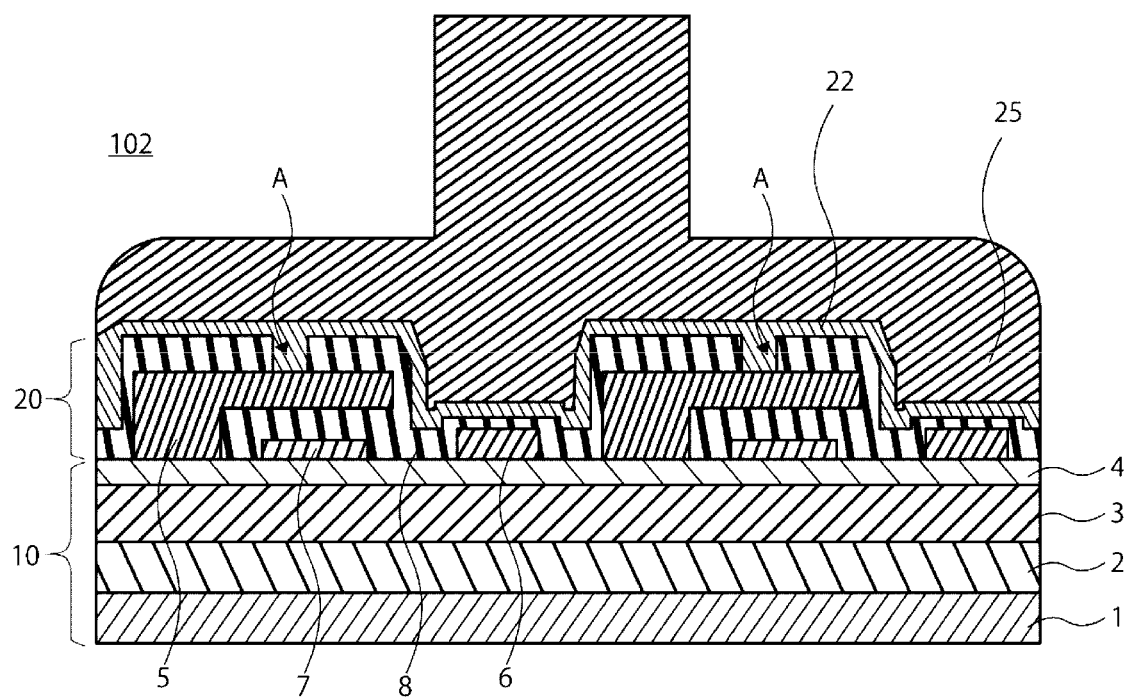
FIG. 6 is a schematic cross-sectional view of a semiconductor device according to a third embodiment.

FIG. 6 shows a schematic cross-sectional view of a semiconductor device 102 according to the third embodiment. FIG. 6 is a partial cross-sectional view of the semiconductor device 102 of the third embodiment in a cross-section corresponding to the A-A' cross-section of FIG. 1. The semiconductor device 102 of the third embodiment has a similar structure as the semiconductor device 100 of the first embodiment except that in the semiconductor device 102, the insulating film 8 is made thicker in a portion lying between the source electrode 5 and the source electrode pad 22 and, though not separately depicted, the insulating film 8 can also be made thicker in a portion lying between the drain electrode 6 and the drain electrode pad 23.

As noted, described embodiments may be combined, in whole or in part, with the other embodiments as applicable. Likewise, with regard to features common to previous embodiments, redundant description is omitted.

As with the first embodiment, the third embodiment can provide a highly-reliable semiconductor device 102.

In the third embodiment, raised/recessed portions are formed in the surface of the source electrode pad 22 and in the surface of the drain electrode pad 23 by changing the thickness of the insulating film 8. In some examples, a laminate of different insulating films may be used for the thick portions of the insulating film 8.

It is possible to prevent a source-drain short circuit and provide a highly-reliable semiconductor device 102 also by thus changing the thickness of the insulating film.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a semiconductor element including a semiconductor layer;
   a first electrode on the semiconductor element at a first location;
   a second electrode on the semiconductor element at a second location spaced from the first location;
   a third electrode on the semiconductor element at a third location between the first and second locations;
   an insulating film on the semiconductor element and covering the first electrode, the second electrode and the third electrode;
   a first electrode pad above the insulating film in a first direction; and
   a second electrode pad above the insulating film in the first direction and spaced from the first electrode pad in a second direction parallel to the semiconductor layer, wherein
   the first electrode and the first electrode pad contact each other in a first opening in a first portion of the insulating film below the first electrode pad,
   the second electrode and the second electrode pad contact each other in a second opening in a second portion of the insulating film below the second electrode pad,
   a bonding surface of the first electrode pad is at a first distance from the semiconductor element in the first direction for a portion of the first electrode pad on the first portion of the insulating film, and at a second distance from the semiconductor element in the first direction for a portion of the first electrode pad on other than the first portion of the insulating film, the first and second distances being different from one another,
   a bonding surface of the second electrode pad is at a third distance from the semiconductor element in the first direction for a portion of the second electrode pad on the second portion of the insulating film, and a fourth distance from the semiconductor element in the first direction for a portion of the second electrode pad on other than the second portion of the insulating film, the third and fourth distances being different from one another, and
   a first portion of the first, second, and third electrodes being under the first electrode pad in the first direction, and
   a second portion of the first, second, and third electrode being under the second electrode pad in the first direction.

2. The semiconductor device according to claim 1, wherein the first distance is greater than the second distance.

3. The semiconductor device according to claim 2, wherein the third distance is greater than the second distance.

4. The semiconductor device according to claim 1, wherein the third distance is greater than the second distance.

5. The semiconductor device according to claim 1, further comprising:
   a first bonding wire bonded to the bonding surface of the first electrode pad; and
   a second bonding wire bonded to the bonding surface of the second electrode pad.

6. The semiconductor device according to claim 1, wherein
   the difference between the first and second distances is greater than 1 micron and less than 10 microns, and
   the difference between the third and fourth distances is greater than 1 micron and less than 10 microns.

7. The semiconductor device according to claim 1, wherein the first electrode pad is thicker at the portion on the first portion of the insulating film than at the portion on the other than the first portion of the insulating film.

8. The semiconductor device according to claim 7, wherein the second electrode pad is thicker at the portion on the second portion of the insulating film than at the portion on the other than the second portion of the insulating film.

9. The semiconductor device according to claim 1, wherein the first electrode is thicker under the first electrode pad than under the second electrode pad.

10. The semiconductor device according to claim 9, wherein the second electrode is thicker under the second electrode pad than under the first electrode pad.

11. The semiconductor device according to claim 1, wherein the first portion of the insulating film is thicker than other portions of the insulating film under the first electrode pad.

12. The semiconductor device according to claim 1, wherein
   the first electrode pad is comprised mainly of aluminum, and
   the second electrode pad is comprised mainly of aluminum.

13. The semiconductor device according to claim 1, further comprising:
   a third electrode pad connected by a wiring to the third electrode, wherein the first electrode pad and the second electrode pad are on an element area of the semiconductor element, and the third electrode pad is on a portion of the semiconductor element outside of the element area.

14. The semiconductor device according to claim 1, wherein the bonding surface of the first electrode pad comprises first raised portions at the first distance from the semiconductor layer and first recessed portions at the second distance from the semiconductor layer, and each first recessed portion has a width in the second direction that is less than a width of each first raised portion in the second direction.

15. The semiconductor device according to claim 14, wherein the bonding surface of the second electrode pad comprises second raised portions at the third distance from the semiconductor layer and second recessed portions at the fourth distance from the semiconductor layer, and each second recessed portion has a width in the second direction that is greater than a width of each second raised portion in the second direction.

16. A semiconductor device, comprising:
a semiconductor element with a semiconductor layer; and
a wiring layer on the semiconductor element, the wiring layer including:
  a first electrode on the semiconductor element,
  a second electrode on the semiconductor element,
  a third electrode on the semiconductor element,
  an insulating film on the first electrode, the second electrode and the third electrode,
  a first electrode pad on the insulating film, having a first bonding surface on the side opposite to the side facing the semiconductor element, a first portion of the first, second, and third electrodes being under the first electrode pad in a first direction orthogonal to the semiconductor layer, and
  a second electrode pad on the insulating film and spaced from the first electrode pad and having a second bonding surface on the side opposite to the side facing the semiconductor element, a second portion of the first, second, and third electrode being under the second electrode pad in the first direction, wherein the first electrode, the second electrode, and the third electrode are between the semiconductor element and the insulating film in the first direction, the second electrode and the first electrode pad are insulated from each other by the insulating film, the first electrode and the second electrode pad are insulated from each other by the insulating film, the first electrode and the first electrode pad connect to each other at a first opening in the insulating film, the second electrode and the second electrode pad connect to each other at a second opening in the insulating film, the distance, along the first direction, from the bonding surface of the first electrode pad to the semiconductor layer at the location where the first electrode pad connects to the first electrode is greater than the distance from the bonding surface of the first electrode pad to the semiconductor layer at a location above the second electrode, and the distance, along the first direction, from the bonding surface of the second electrode pad to the semiconductor layer at the location where the second electrode pad connects to the second electrode is greater than the distance from the bonding surface of the second electrode pad to the semiconductor layer at a location above the first electrode.

17. The semiconductor device according to claim 16, wherein the bonding surface of the first electrode pad has a raised portion and a recessed portion, the raised portion being at the location where the first electrode pad connects to the first electrode, and the recessed portion being at the location above the second electrode, and the bonding surface of the second electrode pad has a raised portion and a recessed portion, the raised portion at the location where the second electrode pad connects to the second electrode, and the recessed portion at the location above the first electrode.

18. The semiconductor device according to claim 17, wherein the width of the recessed portion of the first electrode pad is smaller than the width of the raised portion of the first electrode pad, and the width of the recessed portion of the second electrode pad is larger than the width of the raised portion of the second electrode pad.

19. The semiconductor device according to claim 17, further comprising:

a first bonding wire connected to the bonding surface of the first electrode pad; and a second bonding wire is connected to the bonding surface of the second electrode pad.

20. A semiconductor device, comprising:
a semiconductor element including a nitride semiconductor layer;
a source electrode on the semiconductor element at a first location;
a drain electrode on the semiconductor element at a second location spaced from the first location;
a gate electrode on the semiconductor element at a third location between the first and second locations;
an insulating film above the semiconductor element in a first direction and covering the source electrode, the drain electrode and the gate electrode;
a first electrode pad on a first surface side of the insulating film; and
a second electrode pad on the first surface side of the insulating film spaced from the first electrode pad, wherein the source electrode and the first electrode pad contact each other in a first opening in a first portion of the insulating film below the first electrode pad, the drain electrode and the second electrode pad contact each other in a second opening in a second portion of the insulating film below the second electrode pad, a bonding surface of the first electrode pad is at a first distance from the semiconductor element for a portion of the first electrode pad on the first portion of the insulating film, and at a second distance from the semiconductor element for a portion of the first electrode pad on other than the first portion of the insulating film, the first distance being greater than the second distance, a bonding surface of the second electrode pad is at a third distance from the semiconductor element for a portion of the second electrode pad on the second portion of the insulating film, and a fourth distance from the semiconductor element for a portion of the second electrode pad on other than the second portion of the insulating film, the third distance being greater than the fourth distance, a first portion of the first, second, and third electrodes is under the first electrode pad in the first direction, and
a second portion of the first, second, and third electrode is under the second electrode pad in the first direction.

\* \* \* \* \*